(12) United States Patent
Kawamura et al.

(10) Patent No.: US 9,541,088 B2
(45) Date of Patent: Jan. 10, 2017

(54) EVACUATION APPARATUS

(75) Inventors: Takeshi Kawamura, Tokyo (JP);
Koichi Kagawa, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 1454 days.

(21) Appl. No.: 10/563,255

(22) PCT Filed: Oct. 14, 2004

(86) PCT No.: PCT/JP2004/015563
§ 371 (c)(1),
(2), (4) Date: Jun. 9, 2006

(87) PCT Pub. No.: WO2005/038255
PCT Pub. Date: Apr. 28, 2005

(65) Prior Publication Data
US 2007/0104587 A1    May 10, 2007

(30) Foreign Application Priority Data

Oct. 17, 2003   (JP) .................................. 2003-358424

(51) Int. Cl.
| | |
|---|---|
| *F04C 18/16* | (2006.01) |
| *F04C 28/08* | (2006.01) |
| *C23C 16/44* | (2006.01) |
| *F04C 18/12* | (2006.01) |
| *F04C 23/00* | (2006.01) |
| *F04C 25/02* | (2006.01) |
| *H01J 37/32* | (2006.01) |
| *F01C 21/00* | (2006.01) |

(52) U.S. Cl.
CPC ........... *F04C 28/08* (2013.01); *C23C 16/4412* (2013.01); *F01C 21/007* (2013.01); *F04C 18/126* (2013.01); *F04C 18/16* (2013.01); *F04C 23/001* (2013.01); *F04C 23/005* (2013.01); *F04C 25/02* (2013.01); *H01J 37/32834* (2013.01)

(58) Field of Classification Search
CPC ....... F04C 18/16; F04C 23/001; F04C 23/005; F04C 25/02; F04C 2220/10; F04D 19/04
USPC .......................... 417/205, 12, 410.1; 418/5, 9
See application file for complete search history.

(56) References Cited

U.S. PATENT DOCUMENTS

| | | | | |
|---|---|---|---|---|
| 3,667,874 | A * | 6/1972 | Weatherston et al. | ............ 418/9 |
| 3,922,117 | A * | 11/1975 | Weatherston | ...................... 418/9 |
| 4,442,353 | A * | 4/1984 | Baubron | ....................... 250/281 |
| 4,714,418 | A * | 12/1987 | Matsubara et al. | ........ 418/201.1 |
| 4,770,609 | A * | 9/1988 | Uchida et al. | ..................... 417/2 |
| 4,789,314 | A * | 12/1988 | Higuchi et al. | .................... 418/9 |

(Continued)

FOREIGN PATENT DOCUMENTS

| | | | |
|---|---|---|---|
| EP | 355171 A1 * | 2/1990 | |
| EP | 1 130 264 A | 9/2001 | |

(Continued)

*Primary Examiner* — Patrick Hamo
(74) *Attorney, Agent, or Firm* — Westerman, Hattori, Daniels & Adrian, LLP (57) ABSTRACT

The present invention relates to an evacuation apparatus for evacuating a vacuum chamber of a substrate processing apparatus for processing a substrate such as a semiconductor wafer or liquid crystal panel. An evacuation apparatus according to the present invention includes a first vacuum pump connected to a vacuum chamber, and a second vacuum pump connected to the first vacuum pump. The first vacuum pump has a pair of multistage pump rotors.

16 Claims, 6 Drawing Sheets

(56) References Cited

U.S. PATENT DOCUMENTS

| | | | |
|---|---|---|---|
| 4,850,806 A * | 7/1989 | Morgan et al. | 417/53 |
| 4,887,941 A * | 12/1989 | Crinquette et al. | 417/2 |
| 4,950,968 A * | 8/1990 | Ogura | 318/599 |
| 5,378,128 A * | 1/1995 | Yanagisawa | 418/9 |
| 5,501,583 A * | 3/1996 | Nagaoka et al. | 417/423.4 |
| 5,584,669 A * | 12/1996 | Becker | 417/205 |
| 5,779,453 A * | 7/1998 | Nagayama et al. | 417/410.4 |
| 5,816,782 A | 10/1998 | Nagayama et al. | |
| 5,846,062 A * | 12/1998 | Yanagisawa et al. | 417/410.4 |
| 6,056,510 A * | 5/2000 | Miura et al. | 417/2 |
| 6,375,431 B1 * | 4/2002 | Ando | F04C 18/16 417/44.1 |
| 6,708,981 B2 * | 3/2004 | Hall et al. | 277/431 |
| 6,739,840 B2 * | 5/2004 | Curry | F04D 27/0261 417/326 |
| 6,896,490 B2 * | 5/2005 | Ohmi et al. | 417/244 |
| 2002/0090310 A1 | 7/2002 | Izawa | |
| 2002/0197171 A1 * | 12/2002 | Ojima et al. | 417/410.1 |
| 2003/0097985 A1 | 5/2003 | Kitazawa | |
| 2004/0081565 A1 * | 4/2004 | Kuramoto et al. | 417/360 |
| 2004/0173312 A1 * | 9/2004 | Shibayama et al. | 156/345.29 |
| 2004/0219045 A1 * | 11/2004 | Yoshimura et al. | 418/3 |
| 2005/0074353 A1 * | 4/2005 | Vermoesen et al. | 417/572 |

FOREIGN PATENT DOCUMENTS

| | | |
|---|---|---|
| JP | 04-272492 A | 9/1992 |
| JP | 2000-038999 A | 2/2000 |
| JP | 2002-174174 A | 6/2002 |
| WO | WO03/023229 A | 3/2003 |
| WO | WO 03023229 A1 * | 3/2003 |
| WO | WO03/033761 A2 | 4/2003 |

* cited by examiner

EVACUATION APPARATUS

TECHNICAL FIELD

The present invention relates to an evacuation apparatus for evacuating a vacuum chamber of a substrate processing apparatus.

BACKGROUND ART

An evacuation apparatus is widely used for evacuating a process gas that has been supplied to a vacuum chamber of a substrate processing apparatus. In this substrate processing apparatus such as a CVD apparatus or an etching apparatus, it is required to evacuate the process gas from the vacuum chamber to produce a constant vacuum state therein, and a plurality of vacuum pumps connected in series are used to achieve a desired pumping speed and a desired ultimate pressure.

The above-mentioned evacuation apparatus comprises a booster pump connected to the vacuum chamber, and a main pump connected to the booster pump. Both the booster pump and the main pump are a positive-displacement vacuum pump having a pair of pump rotors disposed in a rotor casing. In this type of vacuum pump, a small gap is formed between the pump rotors and also between the pump rotors and an inner surface of the rotor casing, so that these pump rotors can be rotated in the rotor casing in a non-contact manner.

Generally, a single-stage vacuum pump having a pair of Roots-type single-stage pump rotors is used as the booster pump. This is because the conventional CVD apparatus and etching apparatus do not require a large quantity of the process gas for processing a substrate and thus a quantity of the process gas to be evacuated is not so large.

However, as a substrate such as a semiconductor wafer or a liquid crystal panel, which is an object to be processed, becomes large in size, there has been an increasing need for evacuating a large quantity of the process gas. In order to evacuate the process gas in large quantity, it is required to use large-sized pump rotors or to increase a rotational speed of the pump rotors so as to increase a pumping speed. However, with such a structure, a motor for driving the booster pump is overloaded, resulting in increased power consumption. In addition, the pump rotors are likely to expand due to heat of compression of the process gas and heat generated by the motor, and hence the pump rotors may be brought into contact with the inner surface of the rotor casing, resulting in operation failure. Accordingly, it is difficult for the conventional evacuation apparatus having the single-stage booster pump to evacuate a large quantity of the process gas while maintaining a vacuum state in the vacuum chamber. Under such circumstances, there has been a need for an evacuation apparatus which can evacuate a large quantity of a gas (e.g., a process gas) and can prevent a motor thereof from being overloaded.

DISCLOSURE OF INVENTION

The present invention has been made in view of the above drawbacks. It is therefore an object of the present invention to provide an evacuation apparatus which can evacuate a large quantity of a gas and can prevent a motor thereof from being overloaded.

In order to achieve the above object, according to one aspect of the present invention, there is provided an evacuation apparatus comprising: a first vacuum pump connected to a vacuum chamber; and a second vacuum pump connected to the first vacuum pump; wherein the first vacuum pump has a pair of multistage pump rotors.

In a preferred aspect of the present invention, each of the multistage pump rotors has an inlet-side rotor and an outlet-side rotor, and an axial width of the inlet-side rotor is larger than an axial width of the outlet-side rotor.

According to the present invention, even in a case where the axial width of the rotor (the inlet-side rotor) of the first vacuum pump is designed to be large, a load on a motor of the first vacuum pump can be small. Therefore, a pumping speed (l/min, a volume of a gas evacuated per unit time) can be large, and hence a large quantity of gas can be evacuated.

In a preferred aspect of the present invention, the first vacuum pump is started after the second vacuum pump is started.

According to the present invention, the first vacuum pump can be started after an outlet-side pressure, i.e., a back pressure, of the first vacuum pump is lowered by the second vacuum pump.

In a preferred aspect of the present invention, a rotational speed of the multistage pump rotors is controlled based on a temperature of a gas delivered by the evacuation apparatus, a pressure of the gas, a temperature of a rotor casing for housing the multistage pump rotors, or electric current flowing into a motor for rotating the multistage pump rotors.

According to the present invention, the multistage pump rotors can be prevented from expanding due to heat of compression of the gas and heat of the motor. Therefore, it is possible to prevent the multistage pump rotors from being brought into contact with an inner surface of the rotor casing. Further, the motor can be prevented from being overloaded, and hence heat generation and the power consumption of the motor can be reduced.

In a preferred aspect of the present invention, the first vacuum pump and the second vacuum pump are accommodated in a single enclosure.

BEST MODE FOR CARRYING OUT THE INVENTION

An evacuation apparatus according to an embodiment of the present invention will be described below with reference to the drawings.

Figure 1:
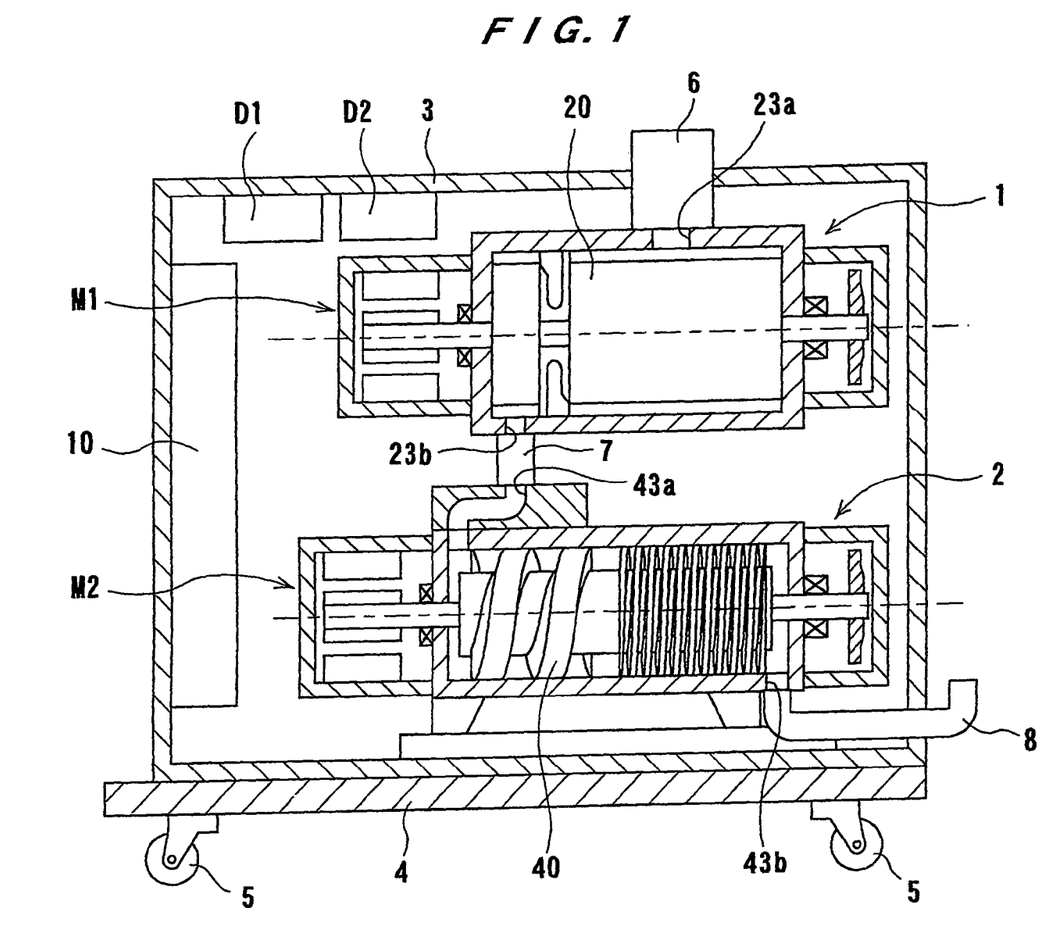
FIG. 1 is a side view showing an evacuation apparatus according to an embodiment of the present invention.
Figure 2:
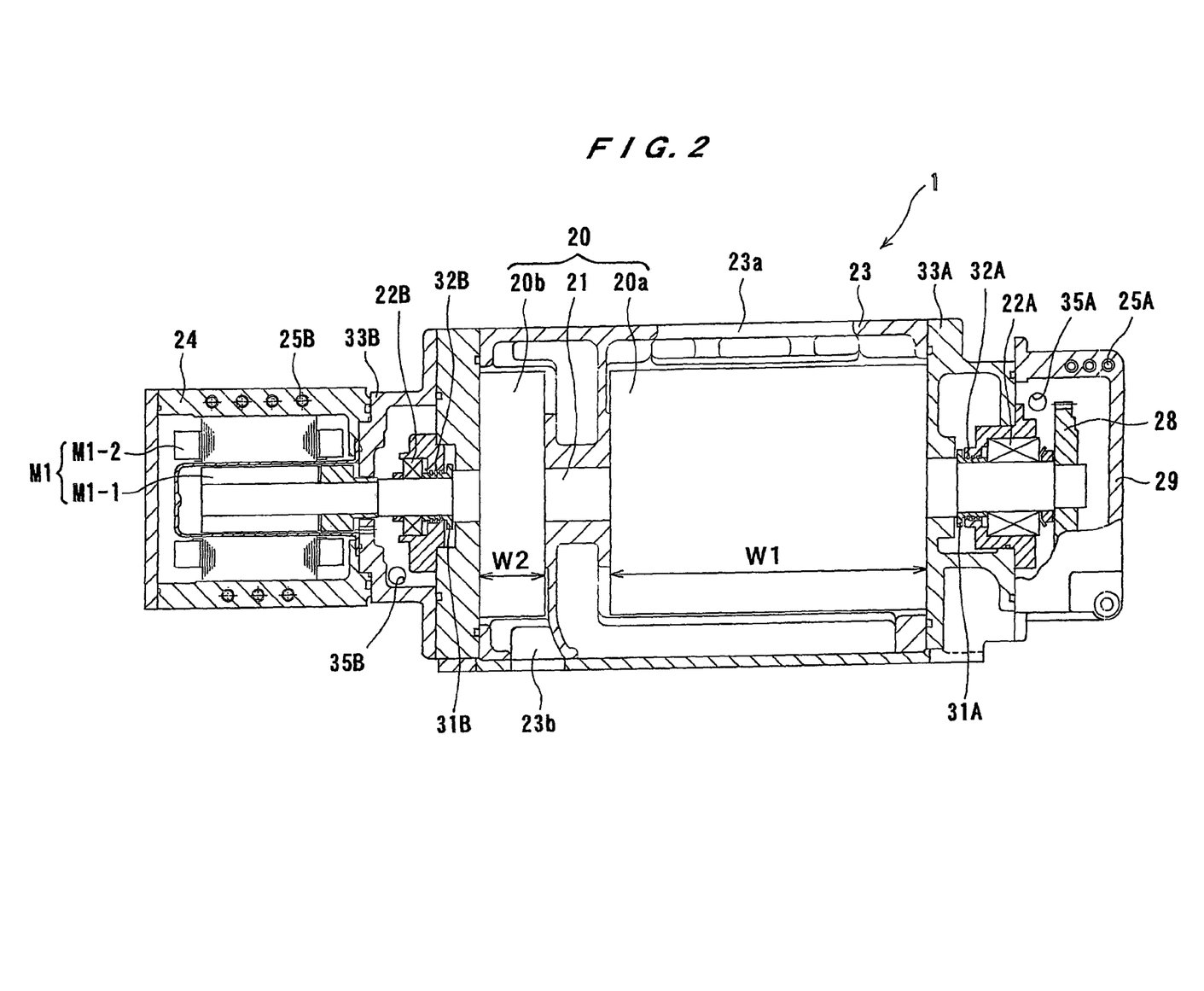
FIG. 2 is a cross-sectional view showing a first vacuum pump shown in FIG. 1.

FIG. 1 is a side view showing an evacuation apparatus according to the embodiment of the present invention. FIG. 2 is a cross-sectional view showing a first vacuum pump shown in FIG. 1. FIGS. 3A through 3D are schematic views illustrating the manner in which a gas is delivered.

As shown in FIG. 1, the evacuation apparatus comprises a first vacuum pump 1 serving as a booster pump, a second vacuum pump 2 serving as a main pump, and a housing (an enclosure) 3 for accommodating the first vacuum pump 1 and the second vacuum pump 2 therein. The housing 3 is fixed to an upper surface of a bottom plate 4, and the second vacuum pump 2 is installed on this bottom plate 4. Four wheels 5 (two of which are shown in FIG. 1) are fixed to a lower portion of the bottom plate 4, thus allowing the evacuation apparatus to be transportable.

The first vacuum pump 1 is a Roots-type positive-displacement vacuum pump having a pair of Roots-type pump rotors 20 (only one of which is shown in FIG. 1), and the second vacuum pump 2 is a screw-type positive-displacement vacuum pump having a pair of screw-type pump rotors 40 (only one of which is shown in FIG. 1). That is, the pump rotors of the first vacuum pump 1 and the second vacuum pump 2 have different shapes from each other. The first vacuum pump 1 and the second vacuum pump 2 are disposed in parallel with each other in the housing 3, and the first vacuum pump 1 is disposed above the second vacuum pump 2.

The first vacuum pump 1 has an inlet port 23a communicating with an inlet pipe 6, and the inlet pipe 6 is connected to a vacuum chamber (not shown in FIG. 1) incorporated in a substrate processing apparatus. Examples of the substrate processing apparatus include an etching apparatus and a CVD apparatus for respectively performing an etching process and a CVD process on a substrate such as a semiconductor wafer or a liquid crystal panel. An outlet port 23b is formed in a lower portion of the first vacuum pump 1, and this outlet port 23b is connected to an inlet port 43a of the second vacuum pump 2 via a connecting pipe 7. An outlet port 43b of the second vacuum pump 2 is connected to an outlet pipe 8, so that a gas (e.g., a process gas) is discharged to the exterior through the outlet pipe 8. In this manner, the first vacuum pump 1 and the second vacuum pump 2 are connected in series and the second vacuum pump 2 is disposed downstream of the first vacuum pump 1. Specifically, the first vacuum pump 1 is disposed at a vacuum side (a vacuum-chamber side), and the second vacuum pump 2 is disposed at an atmospheric side. This second vacuum pump 2 is designed such that it can be started under an atmospheric pressure.

On the other hand, the first vacuum pump 1 cannot be started by itself under the atmospheric pressure. Specifically, the first vacuum pump 1 is allowed to be started after an outlet-side pressure (i.e., a back pressure) of the first vacuum pump 1 is lowered to a certain degree. This first vacuum pump (i.e., the booster pump) 1 serves to increase a pumping speed of the second vacuum pump (i.e., the main pump) 2. The second vacuum pump (the main pump) 2 can be operated at pressures ranging from a vacuum to the atmospheric pressure, and serves to lower the outlet-side pressure (i.e., the back pressure) of the first vacuum pump 1.

In this embodiment, a pumping speed ratio of the first vacuum pump 1 to the second vacuum pump 2 is 50,000: 2,500. If a degree of vacuum that is required for the vacuum chamber is higher than the ultimate pressure of the evacuation apparatus of the present embodiment, an ultra-high vacuum pump such as a turbo-molecular pump may be further disposed upstream of the first vacuum pump 1.

A motor driver D1 for supplying electric current to a motor M1 of the first vacuum pump 1 and a motor driver D2 for supplying electric current to a motor M2 of the second vacuum pump 2 are installed on an upper portion of the housing 3. The rotational speeds of the motor M1 and the motor M2 are independently controlled by a control panel (a control unit) 10 via the motor drivers D1 and D2, respectively. The rotational speeds of the motor M1 and the motor M2 can be controlled by varying the frequency of the electric currents supplied respectively to the motor M1 and the motor M2. In this embodiment, both the motor M1 and the motor M2 are a two-axes brushless DC motor.

As shown in FIG. 2, the first vacuum pump 1 comprises the pair of the multistage pump rotors 20 facing each other, and a rotor casing 23 in which the multistage pump rotors 20 are disposed. A small gap is formed between the pump rotors 20 and also between the pump rotors 20 and an inner surface of the rotor casing 23, so that these pump rotors 20 can be rotated in the rotor casing 23 in a non-contact manner. Each of the pump rotors 20 has a first-stage Roots rotor (an inlet-side rotor) 20a disposed at an inlet side, a second-stage Roots rotor (an outlet-side rotor) 20b disposed at an outlet side, and a rotating shaft 21 to which these Roots rotors 20a and 20b are fixed. An axial width W1 of the first-stage Roots rotor 20a is larger than an axial width W2 of the second-stage Roots rotor 20b. Specifically, a ratio of the axial width W1 of the first-stage Roots rotor 20a to the axial width W2 of the second-stage Roots rotor 20b is 2~10:1, preferably 5~10:1. In this embodiment, this ratio is 5:1. In other words, the axial width W1 of the first-stage Roots rotor 20a is two to ten times, preferably five to ten times the axial width W2 of the second-stage Roots rotor 20b. A pumping speed of the first-stage Roots rotor 20a is in the range of 20,000 to 100,000 (l/min), preferably in the range of 50,000 to 100,000 (l/min). In this embodiment, the pumping speed of the first-stage Roots rotor 20a is 50,000 (l/min). The pumping speed of the second-stage Roots rotor 20b of this embodiment is 10,000 (l/min).

Each of the rotating shafts 21 is rotatably supported by an inlet-side bearing 22A and an outlet-side bearing 22B. The inlet port 23a is formed in the rotor casing 23 and is located above the first-stage Roots rotor 20a. The outlet port 23b is also formed in the rotor casing 23 and is located below the second-stage Roots rotor 20b.

The motor M1 which drives the first vacuum pump 1 comprises two motor rotors M1-1 fixed respectively to end portions of the rotating shafts 21, and motor stators M1-2 disposed radially outwardly of the motor rotors M1-1. The motor rotors M1-1 and the motor stators M1-2 are covered with a motor casing 24. In FIG. 2, one of the two motor rotors M1-1 and one of the two motor stators M1-2 are illustrated. The motor stators M1-2 are connected to the above-mentioned motor driver D1. By supplying electric current to the motor stators M1-2, the rotating shafts 21, i.e., the pump rotors 20, are rotated synchronously in opposite directions. A cooling pipe 25B is embedded in a circumferential wall of the motor casing 24, so that the motor M1 is cooled by a cooling liquid flowing through the cooling pipe 25B.

A pair of timing gears 28, which mesh with each other, are fixed to the other end portions of the rotating shafts 21. These timing gears 28 are housed in a gear casing 29. A cooling pipe 25A is embedded in a circumferential wall of the gear casing 29, so that the timing gears 28 and the bearings 22A are cooled by a cooling liquid flowing through the cooling pipe 25A. Since the synchronous rotation of the pump rotors 20 is performed by the motor M1, the function of the timing gears 28 is to prevent the synchronous rotation of the pump rotors 20 from being disturbed due to accidental causes.

Shaft sleeves 31A (one of which is shown in FIG. 2) are fixed respectively to the rotating shafts 21 at a position between the bearing 22A and the first-stage Roots rotor 20a. Labyrinth seals 32A (one of which is shown in FIG. 2) are disposed so as to surround outer surfaces of the shaft sleeves 31A, respectively. In addition, shaft sleeves 31B (one of which is shown in FIG. 2) are fixed respectively to the rotating shafts 21 at a position between the bearing 22B and the second-stage Roots rotor 20b, and labyrinth seals 32B (one of which is shown in FIG. 2) are disposed so as to surround outer surfaces of the shaft sleeves 31B, respectively. These labyrinth seals 32A and 32B prevent a gas (a process gas) compressed by the pump rotors 20 from entering regions where the bearings 22A, the bearings 22B, and the motor M1 are located. Oil is used as lubricant of the bearings 22A and 22B, so that even when by-products of the process gas are deposited on the bearings 22A and 22B, such by-products are removed by the oil flowing through the bearings 22A and 22B.

The bearings 22A and the labyrinth seals 32A are covered with a bearing casing 33A, and the bearings 22B and the labyrinth seals 32B are covered with a bearing casing 33B. The rotor casing 23, the motor casing 24, and the bearing casings 33A and 33B are provided separately from each other, and the rotor casing 23, the bearing casings 33A and 33B, and the motor casing 24 are assembled in this order.

In order to prevent the by-products of the process gas from being deposited on the bearings 22A and 22B and the labyrinth seals 32A and 32B, supply ports 35A and 35B for supplying a clean gas are provided in the gear casing 29 and the bearing casing 33B, respectively. The clean gas supplied from the supply port 35A fills the interior space of the gear casing 29, and then flows through the bearings 22A and the labyrinth seals 32A in this order, thus preventing the bearings 22A and the labyrinth seals 32A from being exposed to the process gas. In the same manner, the clean gas supplied from the supply port 35B flows through the bearings 22B and the labyrinth seals 32B in this order, thus preventing the bearings 22B and the labyrinth seals 32B from being exposed to the process gas. The clean gas may comprise a stable gas, such as air or nitrogen (an inert gas), which does not react with the process gas.

Figure 3A:
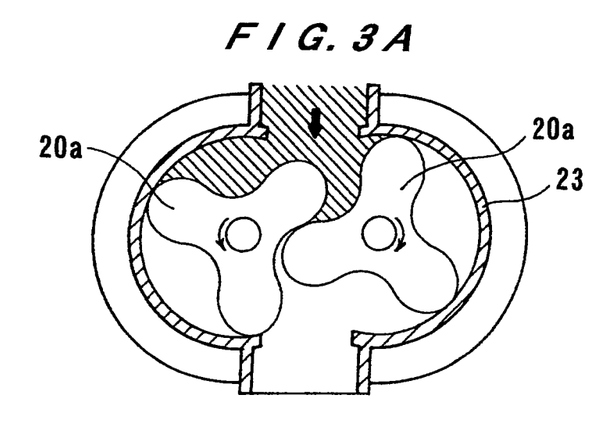
FIGS. 3A through 3D are schematic views illustrating the manner in which a gas is delivered.
Figure 3B:
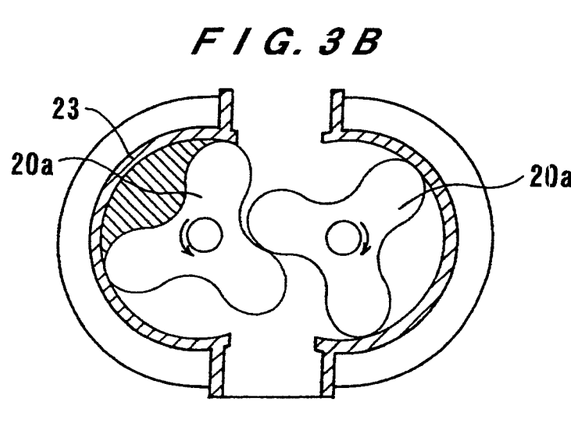
Figure 3C:
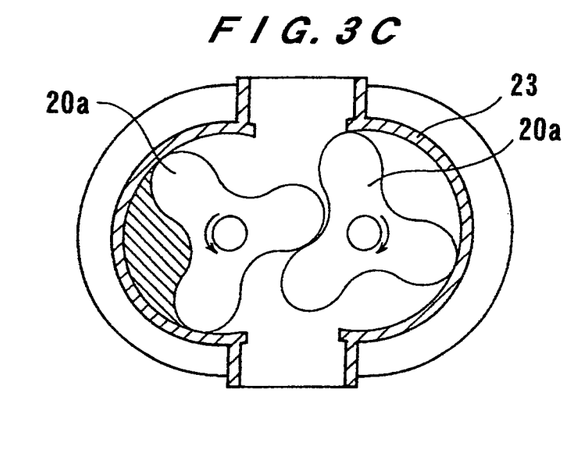
Figure 3D:
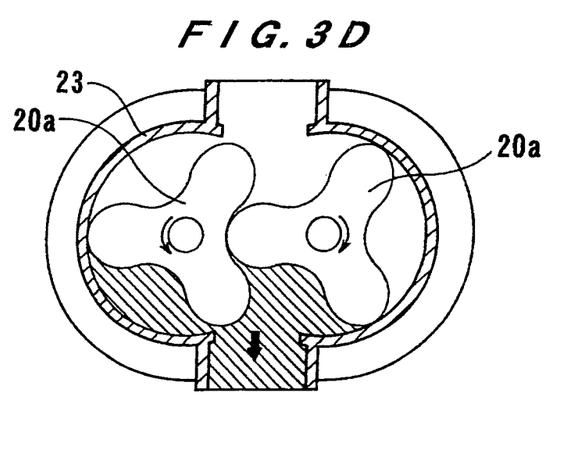

As shown in FIGS. 3A and 3B, the first-stage Roots rotors 20a (and the second-stage Roots rotors 20b) are disposed so as to face each other in the rotor casing 23. When the Roots rotors 20a (i.e., the pump rotors 20) are synchronously rotated by the motor M1, a gas at inlet side is confined in a space defined by the Roots rotor 20a and the inner surface of the rotor casing 23, and then delivered to the outlet side. Such delivery of the gas is continuously performed, and hence the gas is evacuated from the vacuum chamber connected to the inlet port 23a (see FIG. 2). Although the Roots-type rotor is used in this embodiment, a screw-type or claw-type rotor may be used alternatively. In each case where any one of these types is used, the pump rotor is in the form of a multistage pump rotor having multistage rotors arranged in the axial direction. The number of stages of the pump rotor 20 is not limited to two. For example, a pair of pump rotors each having three or more stages may be used.

As described above, according to the present embodiment using the multistage pump rotors 20, even if the axial width W1 of the first-stage Roots rotor 20a is designed to be large compared to the conventional pump, the load on the motor M1 can be small, and hence the power consumption of the motor M1 can be reduced. Further, it is possible to prevent the motor M1 from generating heat and thus to prevent the pump rotors 20 from being brought into contact with the inner surface of the rotor casing 23.

Figure 4:
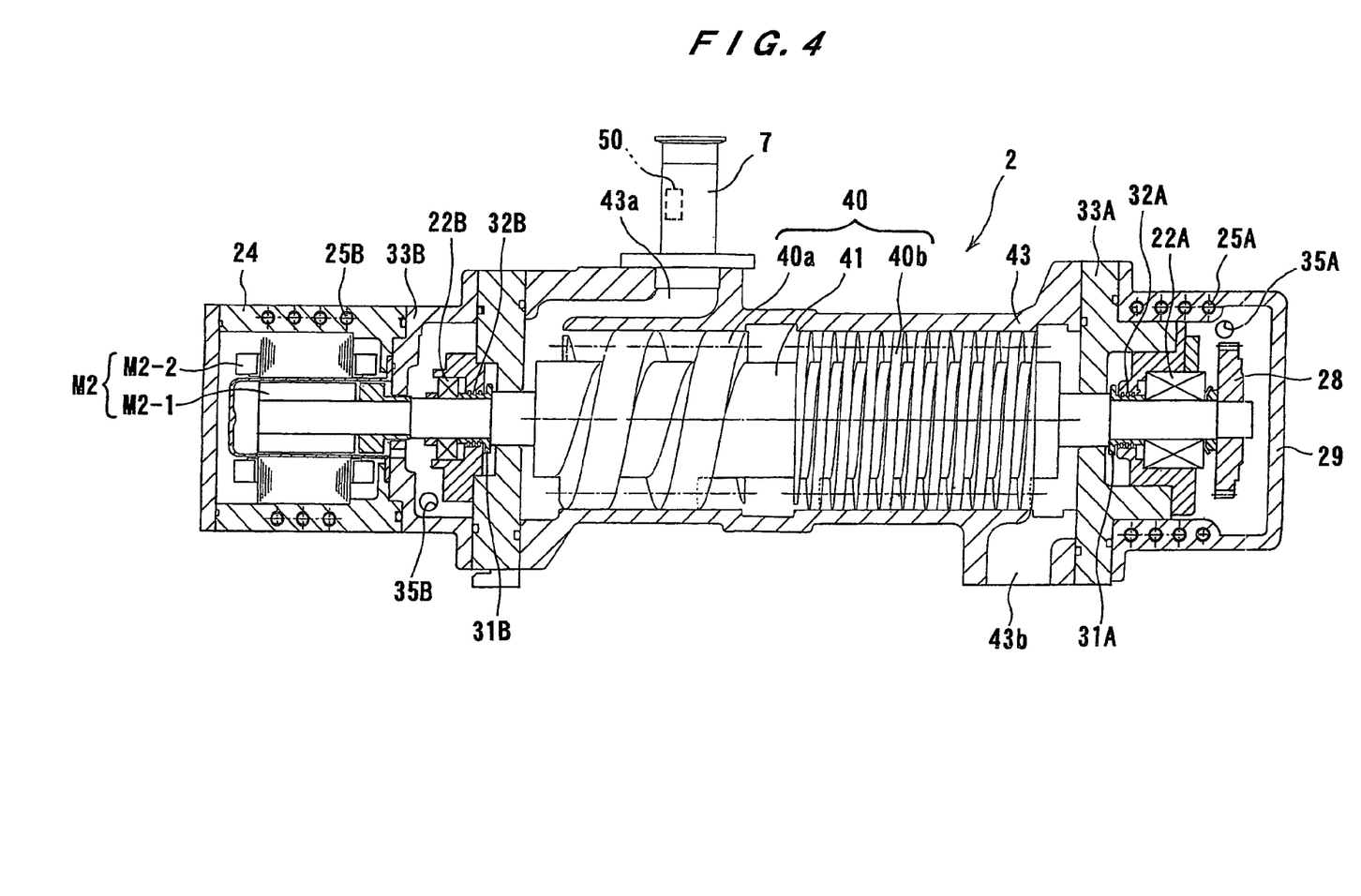
FIG. 4 is a cross-sectional view showing a second vacuum pump shown in FIG. 1.

FIG. 4 is a cross-sectional view showing the second vacuum pump shown in FIG. 1. This second vacuum pump is different from the first vacuum pump in that pump rotors are of a screw-type. Other components of the second vacuum pump are the same as those of the first vacuum pump, and will not be described below repetitively.

As shown in FIG. 4, a pair of screw-type multistage pump rotors 40 (only one of which is illustrated in FIG. 4) are disposed in a rotor casing 43 so as to face each other. These pump rotors 40 are rotated synchronously in opposite directions by a motor M2 comprising motor rotors M2-1 and motor stators M2-2. Each of the pump rotors 40 has a first-stage screw rotor (inlet-side rotor) 40a, a second-stage screw rotor (outlet-side rotor) 40b, and a rotating shaft 41 to which these screw rotors 40a and 40b are fixed. The first-stage and second-stage screw rotors 40a and 40b are disposed so as to mesh with each other, respectively. The first-stage screw rotors 40a have a larger axial width and a larger pitch than those of the second-stage screw rotors 40b. Although the screw-type rotors are used in the second vacuum pump 2 of this embodiment, Roots-type or claw-type rotors may be used alternatively.

A small gap is formed between the pump rotors 40 and also between the pump rotors 40 and an inner surface of the rotor casing 43, so that these pump rotors 40 can be rotated in the rotor casing 43 in a non-contact manner. An inlet port 43a is formed in the rotor casing 43 and is located above the first-stage screw rotors 40a. An outlet port 43b is also formed in the rotor casing 43 and is located below the second-stage screw rotors 40b. The inlet port 43a is connected to the above-mentioned outlet port 23b (see FIGS. 1 and 2) of the first vacuum pump 1 via the connecting pipe 7.

With such an arrangement, a gas (e.g., a process gas) discharged from the first vacuum pump 1 is introduced into the rotor casing 43 from the inlet port 43a through the connecting pipe 7. The gas is compressed by the rotation of the first-stage screw rotors 40a and the second-stage screw rotors 40b, and is then discharged from the outlet port 43b.

In this embodiment, a largest pumping speed is achieved by the first-stage Roots rotors 20a, followed by the second-stage Roots rotors 20b, the first-stage screw rotors 40a, and the second-stage screw rotors 40b.

Since the second vacuum pump 2 is positioned closer to an atmospheric region than the first vacuum pump 1, an internal pressure of the second vacuum pump 2 is higher than that of the first vacuum pump 1. Accordingly, the by-products of the process gas are likely to be deposited in the second vacuum pump 2. In this embodiment, since the second vacuum pump 2 employs the screw-type pump rotors 40, the by-products deposited in the second vacuum pump 2 are scraped off by the rotation of the pump rotors 40. Specifically, even if the by-products are deposited on the first-stage and second-stage screw rotors 40a and 40b and the inner surface of the rotor casing 43, such by-products are scraped off and then delivered to the outlet port 43b by the rotation of the screw rotors 40a and 40b (i.e., the screw-type pump rotors 40). In this manner, the screw rotors 40a and 40b are suitable for eliminating the by-products.

The connecting pipe 7 has a pressure sensor 50 therein for measuring a pressure of a gas (e.g., a process gas) discharged from the first vacuum pump 1. The pressure sensor 50 is connected to the control panel 10 (see FIG. 1), so that the rotational speed of the pump rotors 20 (see FIGS. 1 and 2) of the first vacuum pump 1 is controlled by the control panel 10 based on an output signal (i.e., a pressure of the gas) of the pressure sensor 50.

Next, operation of the evacuation apparatus according to this embodiment will be described with reference to FIG. 5.

Figure 5:
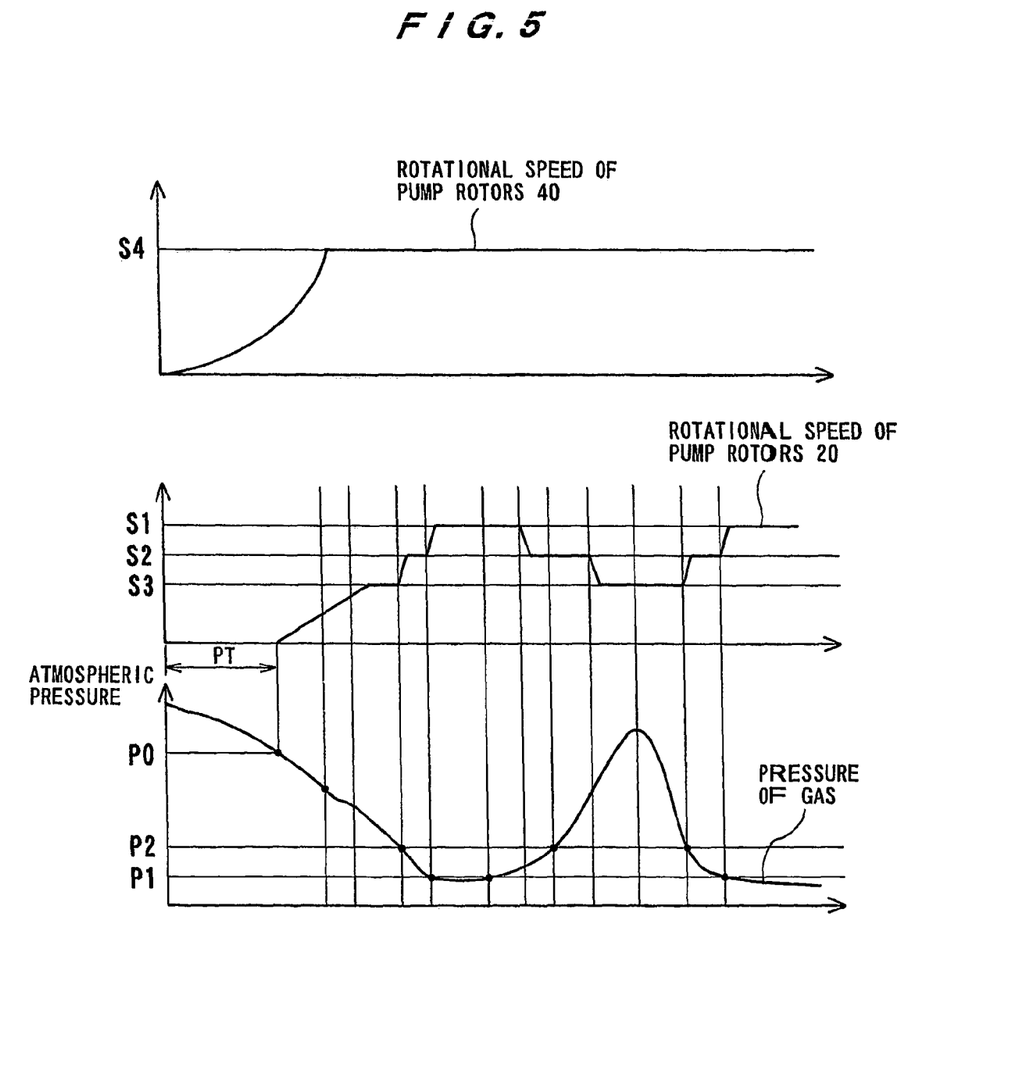
FIG. 5 is a graph illustrating rotational speeds of the first vacuum pump and the second vacuum pump and a pressure of a gas measured by a pressure sensor.

FIG. 5 is a graph illustrating rotational speeds of the first vacuum pump and the second vacuum pump and a pressure of a gas measured by the pressure sensor.

As shown in FIG. 5, the second vacuum pump 2 is firstly started, and the rotational speed of the pump rotors 40 of the second vacuum pump 2 is increased until it reaches a rated rotational speed S4. Thereafter, the second vacuum pump 2 is operated so as to keep the rated rotational speed. After a predetermined period of time PT has passed from when the second vacuum pump 2 is started, the first vacuum pump 1 is started. As an alternative manner, the first vacuum pump 1 may be started after the pressure of the gas reaches a predetermine pressure P0 which is within an allowable range of an evacuating pressure of the second vacuum pump 2. After the rotational speed of the pump rotors 20 of the first vacuum pump 1 reaches S3, the pump rotors 20 are rotated at a constant rotational speed (S3).

As the first vacuum pump 1 and the second vacuum pump 2 are operated, the pressure of the gas (the process gas) is further lowered. When the pressure of the gas is lowered to reach P2, the rotational speed of the pump rotors 20 is further increased. When the rotational speed of the pump rotors 20 reaches S2, the pump rotors 20 are rotated so as to keep the rotational speed S2. Thereafter, when the pressure of the gas reaches P1, the rotational speed of the pump rotors 20 is further increased to reach a rated rotational speed S1. Then, the pump rotors 20 are rotated at a constant rotational speed (S1). If the pressure of the gas is increased due to some sort of cause after the pump rotors 20 reach the rated rotational speed, then the pump rotors 20 is operated to decrease its rotational speed to S2 or S3.

In this manner, the rotational speed of the pump rotors 20 of the first vacuum pump 1 is changed according to the pressure of the gas delivered by the evacuation apparatus, whereby the load on the motor M1 can be reduced. Although the pressure sensor 50 is disposed in the connecting pipe 7 in this embodiment, the pressure sensor may be disposed in the rotor casing 43 of the second vacuum pump 2 at a position between the first-stage screw rotors 40a and the second-stage screw rotors 40b. Alternatively, the pressure sensor may be disposed in the inlet pipe 6 (see FIG. 1), the rotor casing 23 of the first vacuum pump 1, or the inlet port 23a.

Further, the rotational speed of the pump rotors 20 of the first vacuum pump 1 may be changed based on a temperature of the gas being delivered by the evacuation apparatus, a temperature of the rotor casing 23 of the first vacuum pump 1, or electric current flowing into the motor M1 of the first vacuum pump 1. In the case of utilizing the temperature of the gas, it is desirable that a temperature sensor for measuring the temperature of the gas is disposed in the rotor casing 23 of the first vacuum pump 1, for example. In the case of utilizing the temperature of the rotor casing 23 of the first vacuum pump 1, it is desirable that a temperature sensor is disposed on an outer surface of the rotor casing 23. In the case of utilizing the electric current of the motor M1, it is desirable that a current sensor for measuring the electric current flowing into the motor M1 is incorporated in the control panel 10.

Figure 6:
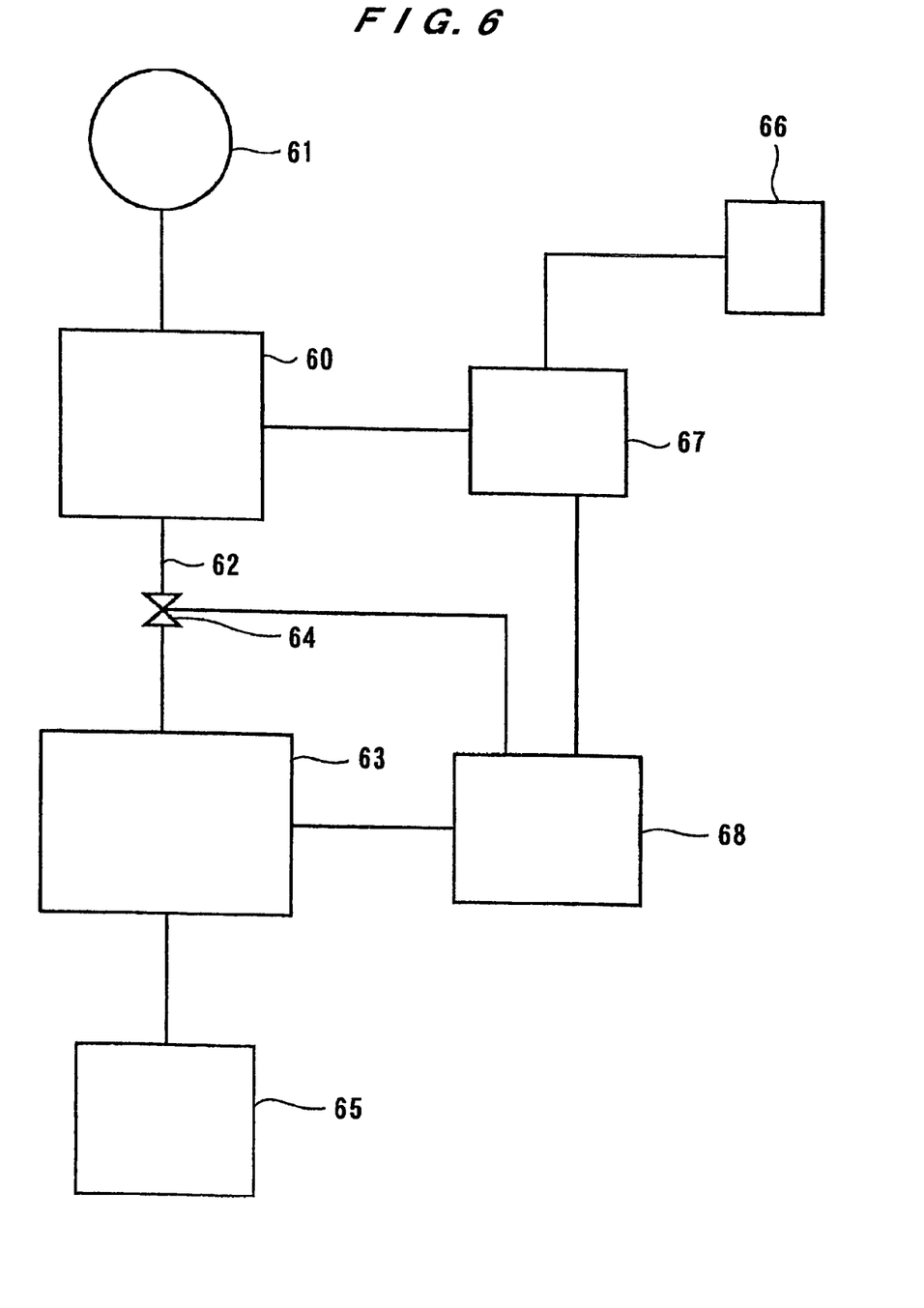
FIG. 6 is a schematic view showing a substrate processing apparatus incorporating the evacuation apparatus according to the embodiment of the present invention.

Next, an example in which the evacuation apparatus of this embodiment is connected to a vacuum chamber of a substrate processing apparatus will be described with reference to FIG. 6. FIG. 6 is a schematic view showing a substrate processing apparatus incorporating the evacuation apparatus according to the embodiment of the present invention.

As shown in FIG. 6, a process gas supply source 61 is disposed upstream of a vacuum chamber 60 so that a process gas is supplied from the process gas supply source 61 to the vacuum chamber 60. The vacuum chamber 60 is connected to the evacuation apparatus 63 according to the present embodiment via a pipe 62. This pipe 62 has a valve 64. By opening this valve 64, the vacuum chamber 60 and the evacuation apparatus 63 communicate with each other through the pipe 62.

An exhaust gas cleaning apparatus 65 for treating an exhaust gas (i.e., the process gas) to be harmless is disposed downstream of the evacuation apparatus 63. Examples of the exhaust gas cleaning apparatus 65 include several types such as a dry type, a wet type, a combustion type, and a catalytic type. A first control unit 67 is connected to the vacuum chamber 60, so that process conditions under which a substrate is processed in the vacuum chamber 60 are controlled by the first control unit 67 (hereinafter, a process performed on the substrate in the vacuum chamber 60 will be referred to as a main process). The control conditions include a type and a temperature of the process gas supplied to the vacuum chamber 60, for example. A second control unit 68 is connected to the evacuation apparatus 63 and the valve 64, so that operating conditions of the evacuation apparatus 63 and open-close operation of the valve 64 are controlled by the second control unit 68. The operating conditions of the evacuation apparatus 63 include the rotational speeds of the pump rotors 20 and 40 (see FIG. 1) and timings of starting the first and second vacuum pumps 1 and 2, for example.

The second control unit 68 is connected to the first control unit 67, so that the first control unit 67 sends the process conditions as a signal to the second control unit 68. The second control unit 68 controls the evacuating apparatus 63 and the valve 64 based on the signal (i.e., the process conditions). A third control unit 66 for controlling a whole process is connected to the first control unit 67. This third control unit 66 sends the signal, which indicates the above-mentioned process conditions for the main process suitable for the whole process, to the first control unit 67. The first control unit 67 controls the main process based on this signal. Several kinds of results of the main process that has been performed in the vacuum chamber 60 are fed back to the first control unit 67.

Operation sequence of this substrate processing apparatus will be carried out as follows: First, a substrate (not shown) is transferred into the vacuum chamber 60. Thereafter, the evacuation apparatus 63 is started while the valve 64 is opened, and is operated at a rated rotational speed. Subsequently, while a degree of vacuum developed in the vacuum chamber 60 is being kept constant, the process gas is supplied from the process gas supply source 61 to the vacuum chamber 60, whereby a predetermined process (the main process) is performed on the substrate.

After the supply of the process gas is stopped to finish the main process, the valve 64 is closed and then the substrate is removed from the vacuum chamber 60. While the valve 64 is closed, the evacuation apparatus 63 can be operated at a lower rotational speed than the rated rotational speed, or the operation of the evacuation apparatus 63 can be stopped. Accordingly, a power consumption of the evacuation apparatus 63 can be reduced. In a case where the degree of vacuum developed in the vacuum chamber 60 is not required to be kept constant, the evacuation apparatus 63 may be operated at a lower rotational speed than the rated rotational speed while the valve 64 is opened.

As described above, according to the present invention, it is possible to evacuate a large quantity of gas without imparting an excessive load on the motor that drives the first vacuum pump.

INDUSTRIAL APPLICABILITY

The present invention is applicable to an evacuation apparatus for evacuating a vacuum chamber of a substrate processing apparatus.

The invention claimed is:

1. An evacuation apparatus for evacuating a process gas in a vacuum chamber of a substrate processing apparatus for fabrication of semiconductors or liquid crystal panels to produce a vacuum in said vacuum chamber, said evacuation apparatus comprising:
a two-stage Roots vacuum pump as a booster pump for evacuation of said vacuum chamber, said booster pump having an inlet port connected to said vacuum chamber via a pipe, an outlet port, and a pair of two-stage Roots-type pump rotors driven by a first motor and supported by bearings, the Roots-type pump rotors comprising an inlet-side Roots rotor as a first stage and an outlet-side Roots rotor as a second stage, and an axial width of said inlet-side Roots rotor being larger than an axial width of said outlet-side Roots rotor, said two-stage Roots vacuum pump is able to be started by said first motor only when a pressure of said outlet port of said two-stage Roots vacuum pump is lowered to a predetermined pressure,
a screw vacuum pump as a main pump for evacuation of said outlet port of said two-stage Roots vacuum pump, said screw vacuum pump having an inlet port connected to said outlet port of said two-stage Roots pump via a pipe, an outlet port, and a pair of screw pump rotors driven by a second motor and supported by bearings, said screw vacuum pump is able to be started by said second motor at an atmospheric pressure in said inlet port of said screw vacuum pump,
wherein said two-stage Roots vacuum pump is configured to operate at a pumping speed larger than a pumping speed of said screw vacuum pump,
and an inert gas is supplied to said two-stage Roots vacuum pump and said screw vacuum pump so that said bearings of said two-stage Roots vacuum pump and said screw vacuum pump are prevented from being exposed to said process gas, and a controller for controlling each rotational speed of said first and second motors so that said screw vacuum pump starts first then said two-stage Roots vacuum pump starts after a time period when said pressure of said outlet port of said two-stage Roots vacuum pump is lowered to said predetermined pressure,
wherein a pumping speed of said inlet-side rotor of said booster pump is in a range of 20,000 Liters/minute to 100,000 Liters/minute, and
a pumping-speed ratio of said inlet-side rotor to said outlet-side rotor of said booster pump is in a range of 2:1 to 10:1.

2. The evacuation apparatus according to claim 1, wherein the pumping speed of said inlet-side rotor of said booster pump is in a range of 50,000 Liters/minute to 100,000 Liters/minute.

3. The evacuation apparatus according to claim 1, wherein the first motor has a pair of motor rotors which are connected to the pair of Roots pump rotors respectively, wherein the pair of Roots pump rotors rotate synchronously in opposite directions to each other so that the pair of Roots pump rotors rotate without mechanical contact to each other.

4. The evacuation apparatus according to claim 3, wherein each of the motor rotors and each of the Roots pump rotors are integral respectively.

5. The evacuation apparatus according to claim 4, wherein each of the integral rotors are supported by two bearings respectively.

6. The evacuation apparatus according to claim 5, wherein each of the Roots pump rotors has a timing gear at an end of the Roots pump rotors which mesh with each other to prevent the synchronous rotation of the Roots pump rotors by the first motor from being disturbed by accidents.

7. The evacuation apparatus according to claim 6, wherein
motor stators of the first motor are disposed radially outwardly of the motor rotors of the first motor and the motor stators are covered with a motor casing, wherein
a cooling pipe is embedded in a wall of the motor casing so that the first motor is cooled by a cooling liquid flowing through the cooling pipe.

8. The evacuation apparatus according to claim 1, wherein the first motor is a two-axes brushless DC motors and the rotational speed of the first motor is controlled by varying frequencies of an electric current supplied to the first motor.

9. The evacuation apparatus according to claim 1, wherein the second motor has a pair of motor rotors which are connected to the pair of screw pump rotors respectively, wherein the pair of screw pump rotors rotate synchronously in opposite directions to each other so that the pair of screw pump rotors rotate without mechanical contact to each other.

10. The evacuation apparatus according to claim 9, wherein each of the motor rotors and each of the screw pump rotors are integral respectively.

11. The evacuation apparatus according to claim 10, wherein each of the screw pump rotors has a timing gear at an end of the screw pump rotors which mesh with each other to prevent the synchronous rotation of the screw pump rotors by the motors from being disturbed by accidents.

12. The evacuation apparatus according to claim 11, wherein
motor stators of the second motor are disposed radially outwardly of the motor rotors of the second motor and the motor stators are covered with a motor easing, wherein
a cooling pipe is embedded in a wall of the motor casing so that the second motor is cooled by a cooling liquid flowing through the cooling pipe.

13. The evacuation apparatus according to claim 12, wherein the gears are housed in a gear casing, wherein a cooling pipe is embedded in a wall of the gear casing so that the gears are cooled by a cooling liquid flowing through the cooling pipe.

14. The evacuation apparatus according to claim 13, wherein the first motor is a two-axes brushless DC motors and the rotational speed of the first motor is controlled by varying frequencies of electric currents supplied to the first motor.

15. The evacuation apparatus according to claim 1, wherein a pumping speed ratio of the Roots vacuum pump to the screw vacuum pump is 20:1.

16. The evacuation apparatus according to claim 1, wherein
a motor stator of the first motor is disposed radially outwardly of the motor rotor of the first motor and the motor stator are covered with a motor casing, and a motor stator of the second motor is disposed radially outwardly of the motor rotor of the second motor and the motor stator are covered with a motor casing, wherein a cooling pipe is embedded at least in a wall of the motor casing of the first or second motor so that the first or second motor is cooled by a cooling liquid flowing through the cooling pipe.

* * * * *